(12) United States Patent
Koshihara et al.

(10) Patent No.: US 7,876,037 B2
(45) Date of Patent: Jan. 25, 2011

(54) ORGANIC ELECTROLUMINESCENCE DEVICE HAVING INPUT FUNCTION AND ELECTRONIC APPARATUS

(75) Inventors: Takeshi Koshihara, Suwa (JP); Sumio Utsunomiya, Matsumoto (JP); Takeyoshi Ushiki, Shiojiri (JP); Yoichi Fujikawa, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 234 days.

(21) Appl. No.: 12/027,639

(22) Filed: Feb. 7, 2008

(65) Prior Publication Data

US 2008/0211394 A1 Sep. 4, 2008

(30) Foreign Application Priority Data

Mar. 2, 2007 (JP) ............................. 2007-052547

(51) Int. Cl.
*H01J 1/62* (2006.01)
*H01J 63/04* (2006.01)

(52) U.S. Cl. ....................... 313/504; 313/512
(58) Field of Classification Search ............... 313/504, 313/506, 512, 468
See application file for complete search history.

(56) References Cited

U.S. PATENT DOCUMENTS

| | | | | |
|---|---|---|---|---|
| 6,107,735 | A * | 8/2000 | Hora | 313/506 |
| 7,106,000 | B2 * | 9/2006 | Han et al. | 313/506 |
| 7,116,044 | B2 * | 10/2006 | Fukunaga | 313/498 |
| 2004/0124765 | A1 * | 7/2004 | Iwase | 313/504 |
| 2004/0198096 | A1 * | 10/2004 | Kim et al. | 439/607 |
| 2004/0212299 | A1 * | 10/2004 | Ishikawa et al. | 313/505 |
| 2005/0093452 | A1 * | 5/2005 | Lin et al. | 313/587 |
| 2005/0134764 | A1 * | 6/2005 | Jeoung et al. | 349/110 |
| 2005/0209392 | A1 * | 9/2005 | Luo et al. | 524/496 |
| 2005/0275347 | A1 * | 12/2005 | Liang et al. | 313/506 |
| 2006/0063462 | A1 * | 3/2006 | Ding et al. | 445/25 |
| 2006/0250064 | A1 * | 11/2006 | Park et al. | 313/112 |
| 2007/0194303 | A1 * | 8/2007 | Harada et al. | 257/40 |
| 2008/0169750 | A1 * | 7/2008 | Kim et al. | 313/498 |

FOREIGN PATENT DOCUMENTS

| | | |
|---|---|---|
| CN | 1549456 A | 11/2004 |
| JP | A 2003-196023 | 7/2003 |
| JP | A 2003-302936 | 10/2003 |
| JP | A 2006-146895 | 6/2006 |

* cited by examiner

*Primary Examiner*—Nimeshkumar D Patel
*Assistant Examiner*—Glenn Zimmerman
(74) *Attorney, Agent, or Firm*—Oliff & Berridge, PLC

(57) ABSTRACT

The invention provides an organic electroluminescence device having an input function, including: an element substrate that has a light-emitting layer sandwiched between a positive electrode and negative electrode in each of a plurality of sub pixel regions that are arrayed in a matrix pattern; a sealing substrate that seals the element substrate; and a touch panel section that is provided at the outer-surface side of the sealing substrate. In such a configuration of the organic electroluminescence device having an input function according to an aspect of the invention, the negative electrode is formed on an individual basis so as to correspond to the display color of each of the sub pixel regions; and the sealing substrate has a shield conductor that is formed on the element-substrate side of the sealing substrate, the shield conductor having a fixed potential.

5 Claims, 7 Drawing Sheets

ORGANIC ELECTROLUMINESCENCE DEVICE HAVING INPUT FUNCTION AND ELECTRONIC APPARATUS

BACKGROUND

1. Technical Field

The present invention relates to an organic electroluminescence device that has an input function. The invention further relates to an electronic apparatus that is provided with such an organic electroluminescence device.

2. Related Art

These days, there are growing expectations for the exploitation of organic electroluminescence devices to a variety of applications such as full-color display use. With the increasing expectations placed thereon, technical study and development of organic electroluminescence devices are now conducted actively. An organic electroluminescence device (i.e., apparatus) uses organic electroluminescence elements as its picture elements, that is, pixels (hereafter the term "electroluminescence" is abbreviated as "EL"). Since an organic EL element is a device (i.e., element) that is driven by an electric current, any variation or fluctuation in a driving electric current supplied thereto leads directly to the degradation of image quality. As one possible factor that could cause such variation or fluctuation in a driving electric current supplied to an organic EL element, it is conceivable that a threshold voltage gets shifted when a thin film transistor drives the organic EL element. In order to provide a technical solution to such an image quality problem, JP-A-2003-302936 discloses a method for controlling an organic EL device that achieves the reduced shift amount of a threshold voltage.

An organic EL element has a layer structure in which a pair of electrodes that is made up of a positive electrode and a negative electrode sandwiches a single-tier or multi-tier thin film that includes at least a light-emitting layer. As a typical related-art configuration thereof, a negative electrode is configured as a solid film electrode and has an electric potential that is common to all pixels in some related-art configurations, an individual, that is, separate, negative electrode is formed for each of R, G, and B three primary color components for the technical purpose of, though not necessarily limited thereto, effectively controlling a voltage that is applied to an R light-emitting layer, a G light-emitting layer, and a B light-emitting layer.

Small-sized information and electronic devices such as personal digital assistants (PDA) and personal computers have become widely used in recent years. With the increasing use of these devices, display devices having a so-called touch panel function have also come into wide use. A display device having a touch panel function allows a user to manually input instructions or the like therein; specifically, a user can make an input by contacting a touching object such as a finger, a pen, or the like, onto the display screen of such a touch-panel display device. In the technical field of touch panel display devices, a capacitive sensing scheme is known as an example of a method for detecting the contact position of a touching object such as a finger or the like, which is disclosed in, for example, JP-A-2006-146895 and JP-A-2003-196023. The capacitive sensing scheme is defined as a method for detecting the contact position of, for example, a finger or the like by means of electrostatic capacitance. When a user touches on the touch-sensitive display screen of a touch panel, electrostatic capacitance is generated. A weak electric current flows as electrostatic capacitance is generated. In the capacitive sensing scheme, the contact position of a touching object is detected on the basis of the amount of such a weak electric current that flows as electrostatic capacitance is generated. A detection electrode that is formed as a sheet and a dielectric film that is deposited on the planar (i.e., sheet-type) detection electrode are used in the capacitive sensing scheme. With such a configuration, in the capacitive sensing scheme, electrostatic capacitance is generated when a user touches on the dielectric film with their finger. It is not technically impracticable to combine a touch panel configuration conforming to the capacitive sensing scheme with an individual negative electrode configuration described above in which a separate negative electrode is formed for each of R, G, and B three primary color components.

However, in the configuration of such a touch-sensitive organic EL device that combines a touch panel configuration conforming to the capacitive sensing scheme with an individual R, G, and B negative electrode configuration described above, there is a conceivable problem of a contact position detection error due to an electric field noise. That is, since an electric field, which is generated by a driving signal that is supplied between a pair of electrodes for driving an organic EL element for light emission, undesirably reaches a detection electrode through a gap region between each two adjacent ones of the individual R, G, and B negative electrodes, the accuracy in the detection of a contact position decreases because of the electric field component that disturbs the functioning of the detection electrode as a noise.

SUMMARY

An advantage of some aspects of the invention is to provide an organic EL device that is capable of preventing the precision in contact position detection from being lowered because of an electric field noise that is generated when organic EL elements are driven for light emission. In addition, the invention further provides, advantageously, an electronic apparatus that is provided with such a high-performance organic EL device to offer reliable contact position detection with enhanced detection accuracy.

In order to address the above-identified problem without any limitation thereto, the present invention adopts the following configuration. The invention provides, as a first aspect thereof, an organic electroluminescence device having an input function, including: an element substrate that has a light-emitting layer sandwiched between a positive electrode and negative electrode in each of a plurality of sub pixel regions that are arrayed in a matrix pattern; a sealing substrate that seals the element substrate; and a touch panel section that is provided at the outer-surface side of the sealing substrate, wherein the negative electrode is formed on an individual basis so as to correspond to the display color of each of the sub pixel regions; and the sealing substrate has a shield conductor that is formed on the element-substrate side of the sealing substrate, the shield conductor having a fixed potential.

In the configuration of the organic electroluminescence device having an input function according to the first aspect of the invention described above, the shield conductor is formed on the element-substrate side of the sealing substrate. In addition, there is a gap between one negative electrode and another (i.e., adjacent one) negative electrode, where the negative electrode is formed on an individual basis so as to correspond to the display color of each of the sub pixel regions. With such a configuration, the shield conductor shuts off an electric field that was generated at the time of emission of light from the light-emitting layer and then propagates to leak through a gap between two adjacent ones of the negative electrodes toward the touch panel section. Therefore, it is possible to reduce the adverse effects of an electric field noise exerted onto the functioning of the touch panel section, where the electric field is generated by a driving signal supplied for the emission of light, thereby making it further possible to improve the accuracy in the contact detection of a touch panel user input made at the touch panel section. Thus, the invention makes it possible to provide an organic EL device that is capable of preventing the precision in contact position detection from being lowered because of an electric field noise that is generated when organic EL elements are driven for light emission.

In the configuration of the organic electroluminescence device having an input function according to the first aspect of the invention described above, it is preferable that the shield conductor should constitute a light-shielding film. If so configured, the shield conductor also functions as the light-shielding film. Therefore, it is possible to reduce the number of parts and components that make up the sealing substrate, thereby making it possible to reduce the thickness of the sealing substrate. In addition to the above, since the shield conductor is provided only at regions where the light-shielding film is formed, optical output efficiency is not sacrificed.

In the configuration of the organic electroluminescence device having an input function according to the first aspect of the invention described above, it is preferable that the shield conductor should have optical transparency.

With such a configuration, it is possible to form the shield conductor in a planar pattern on the condition that the shield conductor is made of an electro-conductive material having optical transparency. Thus, it is possible to effectively and reliably block the adverse effects of a noise at the time of light emission.

In the configuration of the organic electroluminescence device having an input function according to the first aspect of the invention described above, it is preferable that the shield conductor should have a light-transmissive portion that is formed in a planar pattern on the image display area of the sealing substrate and a light-shielding portion that functions as a light-shielding film. In order to heighten the light transmission factor of the light-transmissive portion, it is necessary to make the film thickness of the light-transmissive portion smaller. If done so, however, the resistance value of shield conductor increases, which is undesirable. Nevertheless, it is possible to adjust the resistance value of the shield conductor as a whole by adjusting the film thickness of the light-shielding portion because the light-shielding portion does not have to have optical transparency. That is, in the preferred configuration of the organic EL device having an input function according to the first aspect of the invention described above, it is possible to counterbalance an increase in the resistance value due to the reduced film thickness of the light-transmissive portion with a decrease in the resistance value obtained by adjusting the film thickness of the light-shielding portion. By this means, it is possible to maintain the resistance value of the shield conductor as a whole at a predetermined value. In addition, since the light-shielding portion is formed in a planar pattern to demarcate the image display area, it is possible to effectively and reliably block the adverse effects of a noise. Moreover, since the light-shielding portion is configured to have a small film thickness, it is possible to output light that is emitted from the light-emitting layer to the outside with high optical efficiency. Moreover, in the preferred configuration of the organic EL device having an input function according to the first aspect of the invention described above, the light-shielding portion makes it possible to avoid the occurrence of optical leakage through a gap between each two adjacent ones of the plurality of sub pixel regions.

In order to address the above-identified problem without any limitation thereto, the invention provides, as a second aspect thereof, an electronic apparatus that is provided with the above-described organic electroluminescence device having an input function.

Since the electronic apparatus according to the second aspect of the invention is provided with, for example as its display unit, the organic electroluminescence device having an input function that is capable of preventing the precision in contact position detection from being lowered because of an electric field noise that is generated when organic EL elements are driven for light emission, the electronic apparatus features greater performance in the detection of a touch panel user input with an increased reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
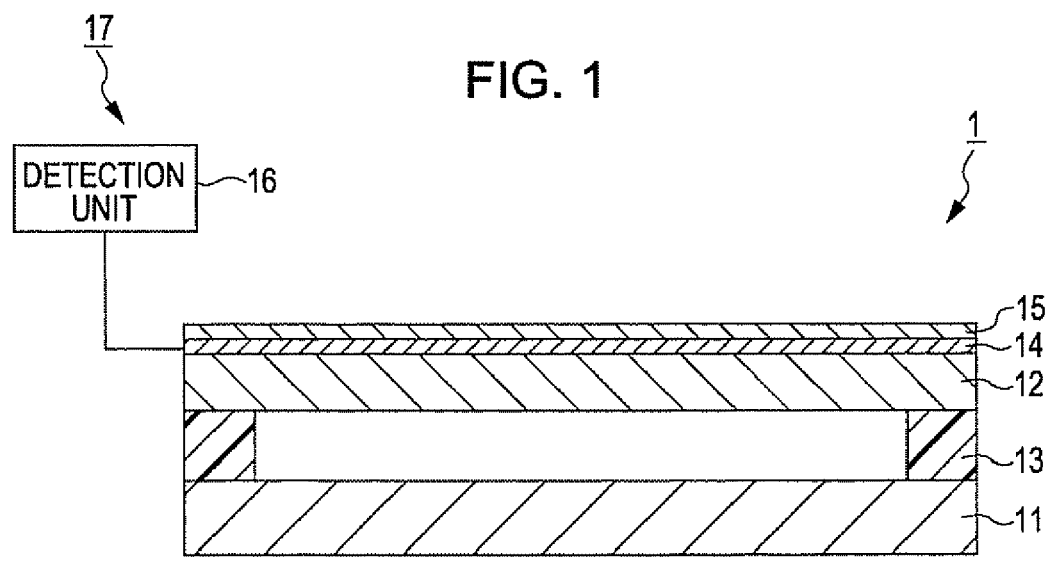
FIG. 1 is a sectional view that schematically illustrates an example of the configuration of an organic EL device having an input function according to a first exemplary embodiment of the invention.
Figure 2:
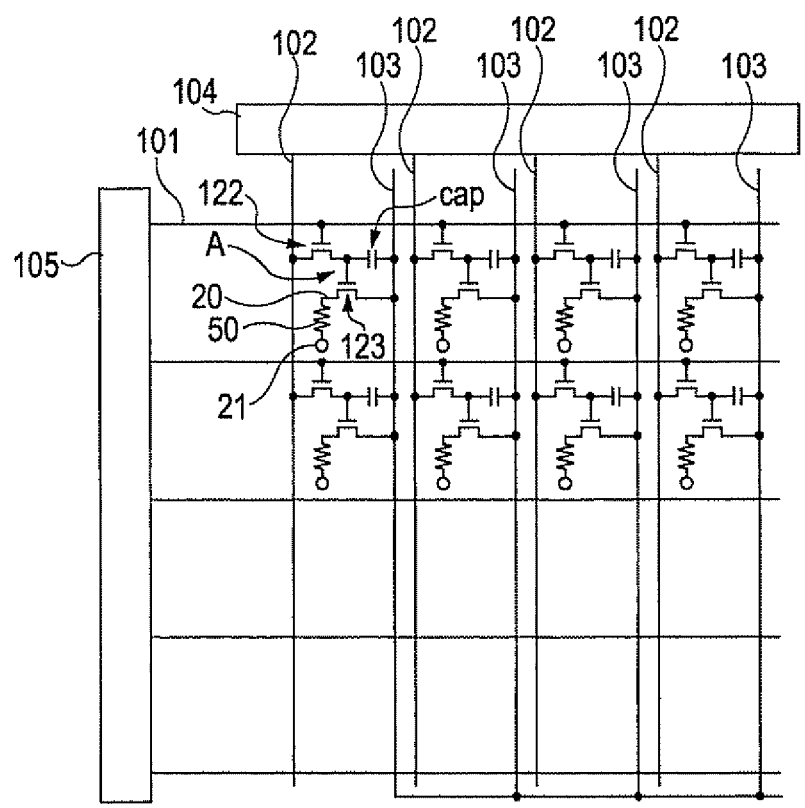
FIG. 2 is a plan view (equivalent circuit diagram) that illustrates an example of the touch-sensitive organic EL device according to the first exemplary embodiment of the invention.
Figure 3:
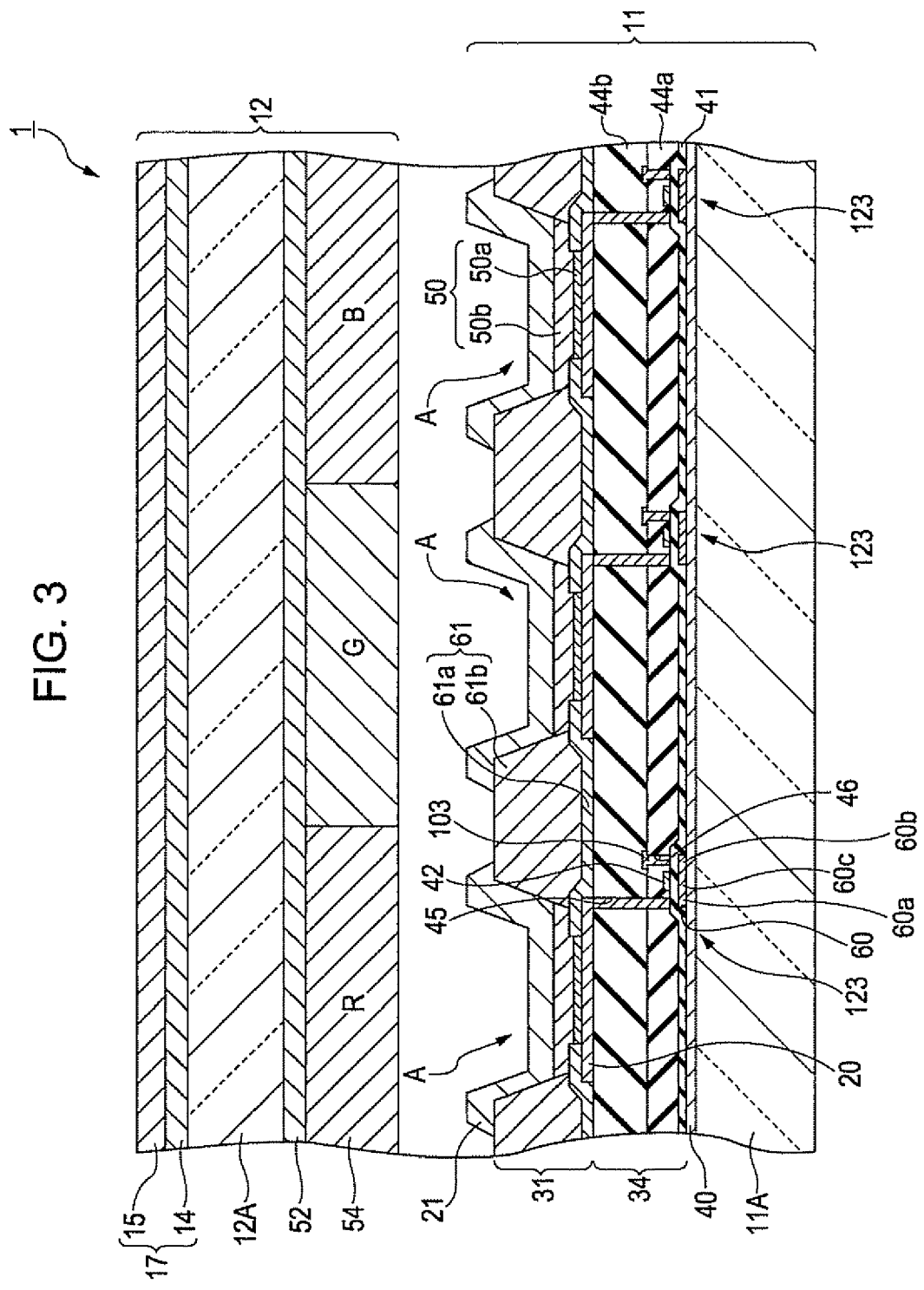
FIG. 3 is a sectional view that schematically illustrates an example of the configuration of an image display area of the organic EL device having an input function according to the first exemplary embodiment of the invention.

With reference to the accompanying drawings, an organic electroluminescence device having an input function according to a first exemplary embodiment of the present invention is described below. In the following description, for convenience of explanation, an "organic electroluminescence device having an input function" may be simply referred to as "organic EL device having an input function" or "touch-sensitive organic EL device", where the term "touch-sensitive" is a non-limiting paraphrasing of "having an input function", if the context allows. It should be noted that different scales are used for members illustrated in each of the accompanying drawings that are referred to in the following explanation so that each of the members illustrated therein has a size that is easily recognizable. FIG. 1 is a sectional view that schematically illustrates an example of the configuration of a touch-sensitive organic EL device (an organic electroluminescence device having an input function) according to a first exemplary embodiment of the invention. FIG. 2 is an equivalent circuit diagram that illustrates an example of the touch-sensitive organic EL device according to the first exemplary embodiment of the invention. FIG. 3 is a sectional view that schematically illustrates an example of the configuration of an image display area of the touch-sensitive organic EL device according to the first exemplary embodiment of the invention. In the configuration of an organic EL device having an input function according to the first exemplary embodiment of the invention, a set of three sub pixel regions constitutes one pixel. Each one of these three sub pixel regions contributes to the outputting of the corresponding one of three primary color components, that is, red (R), green (G), and blue (B). The sub pixel region is defined as the minimum unit of a display region for image display.

First of all, in the following description, an explanation is given of the general configuration of an organic EL device 1 having an input function according to the first exemplary embodiment of the invention. As illustrated in FIG. 1, the organic EL device 1 having an input function according to the first exemplary embodiment of the invention is provided with an element substrate 11, which is an active matrix substrate, and a counter sealing substrate 12 that is opposed to (i.e., provided in opposition to) the element substrate 11. The organic EL device 1 having an input function according to the first exemplary embodiment of the invention is configured as a so-called top-emission type display device. That is, light emitted from a light-emitting layer formed on (i.e., in) the element substrate 11 of the top-emission type organic EL device 1 goes out through the counter sealing substrate 12 thereof.

In addition, the organic EL device 1 having an input function according to the first exemplary embodiment of the invention is further provided with a frame-shaped sealing resin 13. The sealing resin 13, which has a substantially quadrangular shape in a plan view, is provided at the peripheral region around a central region where the element substrate 11 and the counter sealing substrate 12 are opposed to each other. The sealing resin 13 attaches the element substrate 11 and the counter sealing substrate 12 to each other. The sealing resin 13 is made of a thermosetting resin, an ultraviolet (UV) curable resin, or the like. In particular, it is preferable that the sealing resin 13 should be made of an epoxy resin, which is a type of thermosetting resins. The sealing resin 13 is provided for the technical purpose of preventing a light-emitting layer, which is formed on a negative electrode or in a light emission element layer portion, from becoming oxidized. A getter material that absorbs water, oxygen, and the like may be provided inside the sealing resin 13 so as to soak up water or absorb oxygen that infiltrates into a sealing can. In the configuration of the organic EL device 1 having an input function according to the first exemplary embodiment of the invention, an image display region is formed at an area inside the sealing resin 13.

Further in addition, the organic EL device 1 having an input function according to the first exemplary embodiment of the invention is provided with a detection electrode 14, a dielectric film 15, and a detection unit 16. The detection electrode 14 is provided on the outer surface of the counter sealing substrate 12, or in other words, on one surface thereof that is opposite to the other surface that is opposed to the element substrate 11. The dielectric film 15 is deposited on the outer surface of the detection electrode 14. The detection unit 16 detects a position at which electrostatic capacitance is generated via the dielectric film 15 between the detection electrode 14 and a touching object. A combination of the detection electrode 14, the dielectric film 15, and the detection unit 16 constitutes a so-called a touch panel unit 17 that operates in compliance with the so-called capacitive sensing scheme.

As illustrated in FIG. 2, the organic EL device 1 having an input function according to the first exemplary embodiment of the invention has a plurality of scanning lines 101, and a plurality of signal lines 102 each of which extends in a direction orthogonal to a direction in which each of the plurality of scanning lines 101 extends. The organic EL device 1 having an input function according to the first exemplary embodiment of the invention further has a plurality of power lines 103, each of which extends in parallel with the corresponding one of the plurality of signal lines 102. A sub pixel region A is provided at a position corresponding to each one of a plurality of intersections formed by the plurality of scanning lines 101 and the plurality of signal lines 102 extending perpendicular to each other.

A data-line-side driving circuit 104, which is provided with a shift register, a level shifter, a video line, and an analog switch, is connected to each of the signal lines 102. On the other hand, a scanning-line-side driving circuit 105, which is provided with a shift register and a level shifter, is connected to each of the scanning lines 101. In addition, in each of the sub pixel regions A, a switching thin film transistor 122, a hold capacitor (i.e., retention volume) "cap" (hereafter referred to as cap, that is, without a double quotation mark), a driving thin film transistor 123, a pixel electrode (i.e., positive electrode) 20, and an organic EL layer 50 are formed. A scanning signal is supplied from the scanning line 101 to the gate electrode of the switching thin film transistor 122. A pixel signal is supplied from the signal line 102 to the hold capacitor cap via the switching thin film transistor 122. The hold capacitor cap retains the pixel signal supplied thereto. The pixel signal retained at the hold capacitor cap is then supplied to the gate electrode of the driving thin film transistor 123. A driving electric current flows from the power line 103 into the pixel electrode 20 when the pixel electrode 20 is electrically connected to the power line 103 via the driving thin film transistor 123. The organic EL layer 50 is sandwiched between the pixel electrode 20 and a counter electrode (i.e., opposite electrode, negative electrode) 21. A combination of the pixel electrode 20, the counter electrode 21, and the organic EL layer 50 constitutes a light emission element.

When the scanning line 101 is activated (i.e., driven) so as to turn the switching thin film transistor 122 into an ON state, the potential of the signal line 102 at the time thereof is retained at the hold capacitor cap. Depending on the current (i.e., present) state of the hold capacitor cap, the ON/OFF state of the driving thin film transistor 123 is determined. Then, an electric current flows from the power line 103 into the pixel electrode 20 via the channel region of the driving thin film transistor 123. Subsequently, the electric current flows through the organic EL layer 50 into the counter electrode 21. The organic EL layer 50 emits light depending on the amount of an electric current that flows therethrough.

Next, with reference to FIG. 3, the detailed layer structure of the organic EL device 1 having an input function according to the first exemplary embodiment of the invention is explained below. It should be noted that the sectional view of the organic EL device 1 having an input function according to the first exemplary embodiment of the invention illustrated in FIG. 3 shows a layer portion corresponding to three sub pixel regions A. The element substrate 11 has a base substrate substance 11A as its underlying substrate body. The base substrate substance 11A of the element substrate 11 is made of a transparent substrate such as a glass substrate, though not limited thereto. The element substrate 11 has a circuit element layer portion 34, a light emission element layer portion 31, and the counter electrode 21, which are laminated one on another on the base substrate substance 11A in the order of appearance herein. The circuit element layer portion 34 includes various kinds of circuits such as thin film transistors (TFT). The light emission element layer portion 31 includes the organic EL layer 50. With such a configuration, light emitted from the organic EL layer 50 transmits through the counter electrode 21 to go out from the counter sealing substrate 12, or in other words, at an observer side. As a material of the counter electrode 21, a transparent material such as indium tin oxide (ITO), Pt, Ir, Ni, Pd, or the like is used.

The circuit element layer portion 34 has an underlying protection film 40, which is deposited on the base substrate substance 11A. The underlying protection film 40 is made of a silicon oxide film. An island-pattern semiconductor film 60, which is made of polycrystalline silicon, is formed on the underlying protection film 40. The semiconductor film 60 has a source region 60a and a drain region 60b. The source region 60a and the drain region 60b of the semiconductor film 60 are formed by means of a highly doped phosphorus ion implantation technique. The remaining portion at which the highly doped phosphorus ion is not implanted constitutes a channel region 60c of the semiconductor film 60.

A transparent gate insulation film 41 is deposited to cover both of the underlying protection film 40 and the semiconductor film 60. A gate electrode 42 (i.e., scanning line 101) is formed on the gate insulation film 41 for each semiconductor 60. The gate electrode 42 is made of Al, Mo, Ta, Ti, or W, though not limited thereto. A transparent first inter-bedded insulation film 44a is deposited to cover both the gate electrode 42 and the gate insulation film 41. A transparent second inter-bedded insulation film 44b is deposited on the first inter-bedded insulation film 44a. The gate electrode (Each of the gate electrodes) 42 is provided at a position overlying the channel region 60c of the semiconductor film 60 (the corresponding one of the channel regions 60c of the semiconductor films 60). A contact hole (Each of contact holes) 45 is formed to penetrate through the second inter-bedded insulation film 44b and the first inter-bedded insulation film 44a. The contact hole 45 provides an electric connection to the source region 60a of the semiconductor film 60. On the other hand, a contact hole (Each of contact holes) 46 is formed to penetrate through the first inter-bedded insulation film 44a. The contact hole 46 provides an electric connection to the drain region 60b of the semiconductor film 60.

The pixel electrode (Each of the pixel electrodes) 20, which is made of a transparent material such as an indium tin oxide (ITO) or the like, is formed in a predetermined pattern on the second inter-bedded insulation film 44b. One of two contact holes mentioned above, that is, the contact hole 45, is electrically connected to the pixel electrode 20. The other of two contact holes mentioned above, that is, the contact hole 46, is electrically connected to the power line 103. With the configuration described above, a plurality of the driving thin film transistors 123 each of which is electrically connected to the corresponding one of the pixel electrodes 20 is formed in the circuit element layer portion 34.

The light emission element layer portion 31 has, as its main components, the organic EL layers 50 and bank portions 61. Each of the organic EL layers 50 is deposited on the corresponding one of the plurality of pixel electrodes 20. Each of the bank portions 61 is interposed between one set of the pixel electrode 20 and the organic EL layer 50 and another set of the pixel electrode 20 and the organic EL layer 50 that are horizontally adjacent to each other so as to isolate and partition one organic EL layer 50 from another (i.e., adjacent one) organic EL layer 50. The counter electrode 21 is deposited on the organic EL layers 50. A combination of the pixel electrode 20, the organic EL layer 50, and the counter electrode 21 constitutes a light-emitting element. Each of the pixel electrodes 20 is made of ITO or the like. Each of the pixel electrodes 20 is formed in a rectangular pattern in a plan view. Each of the bank portions 61 is formed to isolate and partition one pixel electrode 20 from another pixel electrode 20 that are adjacent to each other.

As illustrated in FIG. 3, each of the bank portions 61 is made up of a lamination of an inorganic bank layer 61a and an organic bank layer 61b. The inorganic bank layer 61a is deposited as a lower first bank layer closer to the base substrate substance 11A. The organic bank layer 61b, which is an upper second bank layer, is deposited on the inorganic bank layer 61a. The inorganic bank layer 61a serves as a first partition portion. The organic bank layer 61b serves as a second partition portion. The inorganic bank layer 61a is made of, for example, $TiO_2$, $SiO_2$, or the like. The organic bank layer 61b is made of, for example, acrylic resin, polyimide resin, or the like.

Both of the inorganic bank layer 61a and the organic bank layer 61b of each of the bank portions 61 are configured to overlie the peripheral edge portion of the corresponding one of the pixel electrodes 20. In a plan view, the inorganic bank layer 61a partially overlaps the peripheral edge portion of the pixel electrode 20. The organic bank layer 61b also partially overlaps the peripheral edge portion of the pixel electrode 20 in a plan view. Each of two edges of the inorganic bank layer 61a lies at a position closer to the center of the corresponding one of the pixel electrodes 20 than the counterpart edge of the organic bank layer 61b. In other words, the edge of the inorganic bank layer 61a is protruded by a greater distance toward the center of the pixel electrode 20 in comparison with the edge of the organic bank layer 61b.

The organic EL layer 50 is made up of a (electron-) hole-injection/hole-transportation layer 50a and the light-emitting layer 50b. The hole-injection/hole-transportation layer 50a is deposited on the pixel electrode 20. The light-emitting layer 50b is deposited on the hole-injection/hole-transportation layer 50a. The hole-injection/hole-transportation layer 50a has a function of injecting an electron hole into the light-emitting layer 50b. In addition to the hole-injection function described above, the hole-injection/hole-transportation layer 50a has another function of transporting an electron hole inside the hole-injection/hole-transportation layer 50a itself. Thanks to the hole-injection/hole-transportation layer 50a that is interposed between the pixel electrode 20 and the light-emitting layer 50b, it is possible to enhance the element characteristic (i.e., device characteristic) of the light-emitting layer 50b such as light emission efficiency, service life, though not limited thereto. A hole injected from the hole-injection/hole-transportation layer 50a and an electron injected from the counter electrode 21 are re-coupled in the light-emitting layer 50b. By this means, the light-emitting layer 50b performs the emission of light. As a material of the hole-injection/hole-transportation layer 50a, for example, a mixture of polythiophene derivative such as polyethylene dioxythiophene or the like and polystyrene sulphonic acid or the like may be used. Since the organic EL device 1 having an input function according to the present embodiment of the invention is configured as a top-emission type device, a reflective film is formed on the lower surface of the light-emitting layer 50b. The reflective film that is not shown in the drawing makes it possible to obtain an optical output in an efficient manner.

Each of the light-emitting layers 50b, which is configured to cover the corresponding one of the hole-injection/hole-transportation layers 50a, is deposited between the corresponding two adjacent ones of the organic bank layers 61b. The thickness of the light-emitting layer 50b is within a range of 50-80 nm. The light-emitting layer 50b contains three color types of light emission materials including a red light emission material that is capable of emitting red color light, a green light emission material that is capable of emitting green color light, and a blue light emission material that is capable of emitting blue color light. Having such three primary color types of light emission materials, the light-emitting layer 50b is configured to emit white light. The light-emitting layer 50b is a common layer in the sub pixel regions A. That is, in the configuration of the organic EL device 1 having an input function according to the present embodiment of the invention, white light that is emitted from the light-emitting layer 50b is colored when it transmits through a color filter layer 54 that is provided in the counter sealing substrate 12 for color display. A more detailed explanation of the configuration of the color filter 54 is given later. The color filter has colorants that are provided to color incoming white light into red (R) light, green (G) light, and blue (B) light.

As the light-emitting material of a light-emitting layer, a known substance that is capable of emitting fluorescent light or phosphorescent light may be used. Specifically, it is preferable to use a poly silane system substance such as (poly) fluorene derivative (PF), (poly) paraphenylene vinylene derivative (PPV), polyphenylene derivative (PP), polyparaphenylene derivative (PPP), polyvinyl carbazole (PVK), polythiophene derivative, poly methyl phenyl silane (PMPS), though not limited thereto, as the light-emitting material of a light-emitting layer. Or, another high polymeric material such as perylene pigment, coumarin pigment, rhodamine pigment or the like may be doped with the high polymeric material enumerated above as the light-emitting material of a light-emitting layer. Alternatively, a low polymeric material such as rubrene, perylene, 9,10-diphenylanthracene, tetraphenyl-butadiene, nile red, coumarin-6, quinacridon, or the like may be doped with the high polymeric material enumerated above as the light-emitting material of a light-emitting layer. As another alternative example, the low polymeric material enumerated above may be doped with another low polymeric material such as carbazole (CBP) or the like to constitute the light-emitting material of a light-emitting layer. In addition, tris 8-quinolinolato aluminum complex ($Alq_3$) may be added as the electron-transportation-layer part of a light-emitting layer.

The counter electrode 21 is formed on an individual basis so as to correspond to the display color of each of the sub pixel regions A. Specifically, for example, the counter electrode 21 is formed in a stripe pattern extending in the sub pixel regions A corresponding to the red color component of three primary colors, R, G, and B. The counter electrode 21 is deposited between one organic bank layer 61b and another organic bank layer 61b that are formed adjacent to each other in such a manner that, for example, the counter electrode 21 extends from a part of the upper surface of the above-mentioned one organic bank layer 61b onto a part of the upper surface of the above-mentioned another organic bank layer 61b. The organic EL layer 50 is sandwiched between the pixel electrode 20 and the counter electrode 21. The stripe-pattern counter electrode 21 is also formed on an individual basis so as to correspond to the green (G) color component and the blue (B) color component of RGB three primary colors.

Since the counter electrode 21 is formed in a stripe pattern for each color component, it is possible to vary the electric potential of the counter electrode 21 for each display color of R, G, and B on an individual basis. Accordingly, a wide range of adjustment of an electric potential difference between the pixel electrode 20 and the counter electrode 21 is ensured. By this means, it is possible to perform gradation correction such as gamma correction for each display color of R, G, and B in an effective manner.

In this context, the phrase "formed on an individual basis so as to correspond to the display color" means that one counter electrode 21 that is formed in the sub pixel regions A corresponding to one display color and another counter electrode 21 that is formed in the sub pixel regions A corresponding to another display color different from the above-mentioned one display color are not formed as a single counter electrode. That is, the counter electrode 21 may be formed on an individual basis for each of the sub pixel regions A, which is the same as the layout of the pixel electrodes 20. If so configured, it is necessary to provide a switching element that controls the counter electrode 21.

A pair of the pixel electrode 20 and the counter electrode 21 has a function of flowing an electric current through the organic EL layer 50. As has already been described above, the counter electrode 21 is made of a transparent material such as indium tin oxide (ITO), Pt, Ir, Ni, Pd, or the like. It should be noted that the counter electrode 21 may be configured to have a laminated layer structure. When so configured, it is preferable that the ground layer of the counter electrode 21 that is closer or closest to the light-emitting layer should have a lower or the lowest work function. Especially, in the present embodiment of the invention, the counter electrode 21 is deposited to be directly in contact with a light-emitting layer 50b of the organic EL layer 50 so as to inject an electron into the light-emitting layer 50b.

The sealing substrate 12 has a base substrate substance 12A as its main substrate body. The base substrate substance 12A of the sealing substrate 12 is made of a transparent material such as a glass, quartz, plastic, or the like. A shield electrode (i.e., shield conductor) 52 is formed on the inner surface of the base substrate substance 12A (i.e., surface opposed to the element substrate 11). The aforementioned color filter layer 54 is formed on the shield electrode 52.

The shield electrode 52 is formed on the entire region of the inner surface of the base substrate substance 12A of the sealing substrate 12. The shield electrode 52 is made of a light-transmissive, that is, translucent, electro-conductive material such as ITO or the like. The shield electrode 52 is opposed to the pixel electrode 20 and the counter electrode 21 with a sealing layer and the like being interposed therebetween. The sheet resistance of the shield electrode 52 is set at, for example, 1 kΩ/sq or less.

The shield electrode 52 is electrically connected to a circuitry that is provided on the element substrate 11 via inter-substrate electro-conductive terminals, which are provided on the edge region of the sealing substrate 12. The inter-substrate electro-conductive terminals are made of an electro-conductive material. It should be noted that the inter-substrate electro-conductive terminals and the circuitry are not illustrated in the drawing. With the electric connection to the circuitry, the shield electrode 52 is controlled to have a certain substantially fixed electric potential (e.g., ground potential).

The color filter layer 54 is formed so as to correspond to the sub pixel regions A. The color filter layer 54 has, for example, acrylic colorants corresponding to primary colors displayed in the sub pixel regions, though not limited to acrylic ones.

The detection electrode 14 is formed on the entire region of the outer surface of the base substrate substance 12A of the sealing substrate 12. The detection electrode 14 is made of a light-transmissive, that is, translucent, electro-conductive material such as ITO or the like. The detection electrode 14 has a substantially rectangular shape in a plan view. At each of four corners of the detection electrode 14, a terminal to which a detection signal is supplied from the detection unit 16 is provided. It should be noted that these terminals are not illustrated in the drawing.

The detection unit 16 applies an alternating voltage to the terminals provided on the detection electrode 14, where the alternating voltage applied to one terminal has the same phase and the same potential as that applied to other terminals. Accordingly, a uniform electric field is generated on the inner surface of the detection electrode 14. The detection unit 16 is configured to detect a contact position at which a touching object such as a finger or the like is placed on the basis of the measurement value of the amount of an electric current that flows by means of an electrostatic capacitance, which is generated via the dielectric film 15 between the detection electrode 14 and the touching object. As an example of a modified configuration, a circular polarization sheet that is made of a dielectric material such as a polyvinyl alcohol (PVA) or the like and functions as an antireflection film may be used in place of the dielectric film 15.

Operation of Organic EL Device Having Input Function

Next, an explanation is given below of the operation of the organic EL device 1 having an input function according to the first exemplary embodiment of the invention described above. When a voltage is applied between the pixel electrode 20 and the counter electrode 21, a hole is injected from the pixel electrode 20 into the light-emitting layer 50b through the hole-injection/hole-transportation layer 50a. In addition, upon application of a voltage between the pixel electrode 20 and the counter electrode 21, an electron is injected from the counter electrode 21 into the light-emitting layer 50b. Then, the hole injected from the pixel electrode 20 through the hole-injection/hole-transportation layer 50a and the electron injected from the counter electrode 21 are re-coupled in the light-emitting layer 50b. Due to energy generated at the time of the re-coupling of the hole and the electron, peripheral molecules inside the light-emitting layer 50b become excited. A differential energy that is generated at the time when the excited molecules get deactivated from the excitation state into the ground state is emitted in the form of light.

As described above, when the light-emitting layer 50b of the organic EL layer 50 emits light, an electric field is generated between the pixel electrode 20 and the counter electrode 21. As has already been described above, in the configuration of the organic EL device 1 having an input function according to the present embodiment of the invention, the counter electrode 21 is formed on an individual basis so as to correspond to the display color of each of the sub pixel regions A. Accordingly, as understood from FIG. 3, there is a gap between one counter electrode 21 that is formed in the sub pixel regions A corresponding to one display color and another (i.e., adjacent one) counter electrode 21 that is formed in the sub pixel regions A corresponding to another display color different from the above-mentioned one display color. With such a configuration, an electric field, which is generated between the pixel electrode 20 and the counter electrode 21 at the time of emission of light from the light-emitting layer 50b, leaks through the gap between the above-mentioned one counter electrode 21 and the above-mentioned another counter electrode 21. Since the organic EL device 1 having an input function according to the present embodiment of the invention has the shield electrode 52 that is formed on the inner surface of the sealing substrate 12, it is possible to effectively block an electric field that propagates toward the detection electrode 14 thanks to the functioning of the shield electrode 52. In addition, in the configuration of the organic EL device 1 having an input function according to the present embodiment of the invention, there is a sufficiently large clearance between the pixel electrode 20 the counter electrode 21 provided on the element substrate 11 and the shielding electrode 52 provided on the sealing substrate 12. Thus, the intensity of an electric field that goes toward the shield electrode 52 to cause a detection noise is weakened before it reaches thereto.

When a touching object such as a finger or the like becomes in contact with the dielectric film 15 under an operation state where a uniform alternating voltage is applied onto the inner surface of the detection electrode 14, electrostatic capacitance is generated between the detection electrode 14 and the touching object with the dielectric film 15 being interposed therebetween. As the electrostatic capacitance is generated between the detection electrode 14 and the touching object, an electric current flows from the terminals provided on the detection electrode 14 by means of the generated electrostatic capacitance. Then, at each of four corners of the detection region of the detection electrode 14, the detection unit 16 detects, that is, measures, the amount of an electric current that flows as the electrostatic capacitance is generated. On the basis of the measured electric current amount, the detection unit 16 detects the contact position of the touching object such as a finger. The configuration for making such detection is illustrated in FIG. 1 explained above. Since the detection electrode 14 and the shield electrode 52 are isolated from each other with the base substrate substance 12A being sandwiched therebetween, the configuration of the organic EL device 1 having an input function according to the present embodiment of the invention makes it possible to prevent any capacitive component from being generated between the detection electrode 14 and the shield electrode 52.

As explained above, in the configuration of the organic EL device 1 having an input function according to the present embodiment of the invention, the shield electrode 52 is formed at the element-substrate (11) side of the sealing substrate 12. With such a configuration, it is possible to reduce the adverse effects of an electric field noise exerted onto the functioning of the detection electrode 14, where the electric field is generated when the light-emitting layer 50b emits light. Therefore, it is possible to improve the accuracy in the contact detection of a touch panel user input made at the touch panel unit 17. That is, in the configuration of the organic EL device 1 having an input function according to the present embodiment of the invention, the shield electrode 52 shuts off an electric field that was generated at the time of emission of light from the light-emitting layer 50b. The generated electric field that leaks through a gap between two adjacent ones of the counter electrodes 21 toward the detection electrode 14, which is provided on the outer surface of the sealing substrate 12 to constitute a part of the touch panel unit 17, is effectively blocked by the shield electrode 52 and thus does not reach thereto. Therefore, it is possible to prevent the precision in the contact detection of a touch panel user input made at the touch panel unit 17 from being lowered because of a noise that is attributable to an electric field component generated at the time of emission of light.

Second Embodiment

Figure 4:
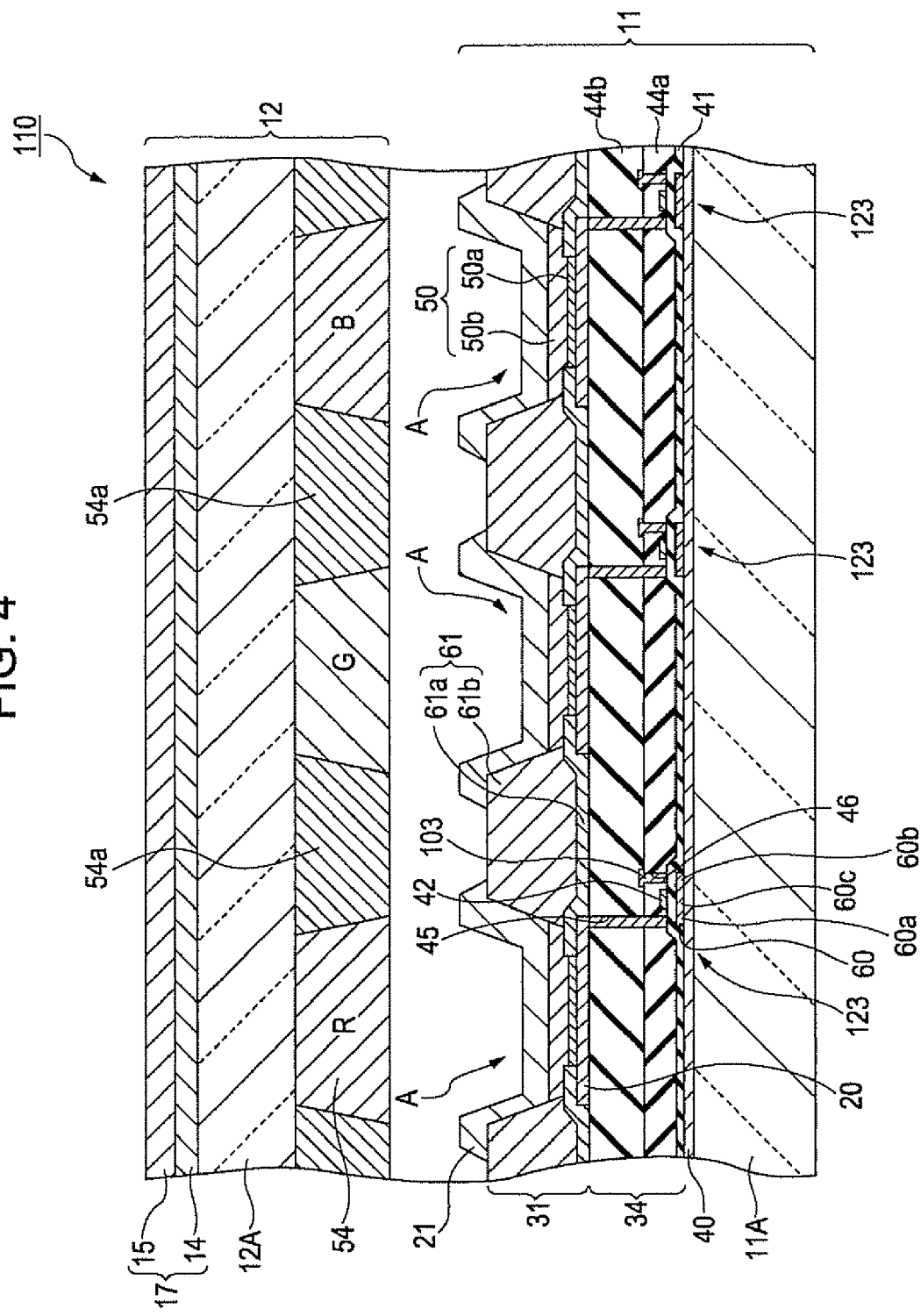
FIG. 4 is a sectional view that schematically illustrates an example of the configuration of an organic EL device having an input function according to a second exemplary embodiment of the invention.

Next, with reference to the accompanying drawings, an organic EL device having an input function according to a second exemplary embodiment of the invention is explained below. FIG. 4 is a sectional view that schematically illustrates the layer configuration of sub pixel regions. An organic EL device having an input function according to the present embodiment of the invention differs from the organic EL device 1 having an input function according to the first exemplary embodiment of the invention described above only in terms of the layer configuration of sub pixel regions. That is, except for the layer configuration of sub pixel regions, an organic EL device having an input function according to the present embodiment of the invention has the same configuration as that of the organic EL device 1 having an input function according to the first exemplary embodiment of the invention. Accordingly, in the following description, an explanation is given with a focus on the differentiating and characteristic feature of the layer configuration of sub pixel regions. It should be noted that the same reference numerals are assigned to the same components as those of the touch-sensitive organic EL device 1 according to the first exemplary embodiment of the invention; and a detailed explanation thereof is omitted, or an explanation is simplified as long as the understanding of the unique feature of the invention is not impaired.

As illustrated in FIG. 4, in the configuration of an organic EL device 110 having an input function according to the present embodiment of the invention, the color filter layer 54 has a light-shielding portion 54a, which functions as a light-shielding layer that shuts off light. The light-shielding portion 54a, which is made of an electro-conductive material, doubles as the shield conductor (i.e., shield electrode) described above. The light-shielding portion 54a is made of a light-absorbing electrical conducting material. As a non-limiting example thereof, the light-shielding portion 54a is made of a light-absorbing metal material such as chromium (Cr) or a light-absorbing resin material with carbon black being dispersed therein. The light-shielding portion 54a is electrically connected to the aforementioned circuitry that is provided on the element substrate 11 via the aforementioned inter-substrate electro-conductive terminals, which are provided on the edge region of the sealing substrate 12. With the electric connection to the circuitry, the light-shielding portion 54a is controlled to have a certain fixed electric potential (e.g., ground potential). The light-shielding portion 54a has open aperture regions each of which corresponds to the sub pixel region A. Notwithstanding the foregoing, the light-shielding portion 54a is capable of blocking, at a sufficient light-shielding level, an electric field that is generated at the time of emission of light from the light-emitting layer 50b between the pixel electrode 20 and the counter electrode 21 by a driving signal supplied to the pixel electrode 20 and propagates toward the detection electrode 14.

As explained above, the organic EL device 110 having an input function according to the present embodiment of the invention offers the same advantageous working effects that are achieved by the organic EL device 1 having an input function according to the first exemplary embodiment of the invention described above in addition thereto, in the configuration of the touch-sensitive organic EL device 110 according to the present embodiment of the invention, the light-shielding portion 54a also functions as the shield electrode. Therefore, it is possible to reduce the number of parts and components that make up the sealing substrate 12 of the organic EL device 110 having an input function. Thus, it is possible to reduce the thickness of the sealing substrate 12 of the organic EL device 110 having an input function. In addition to the above, since the shield electrode is provided only at regions where the light-shielding portion 54a is formed, optical output efficiency is not sacrificed.

Third Embodiment

Figure 5:
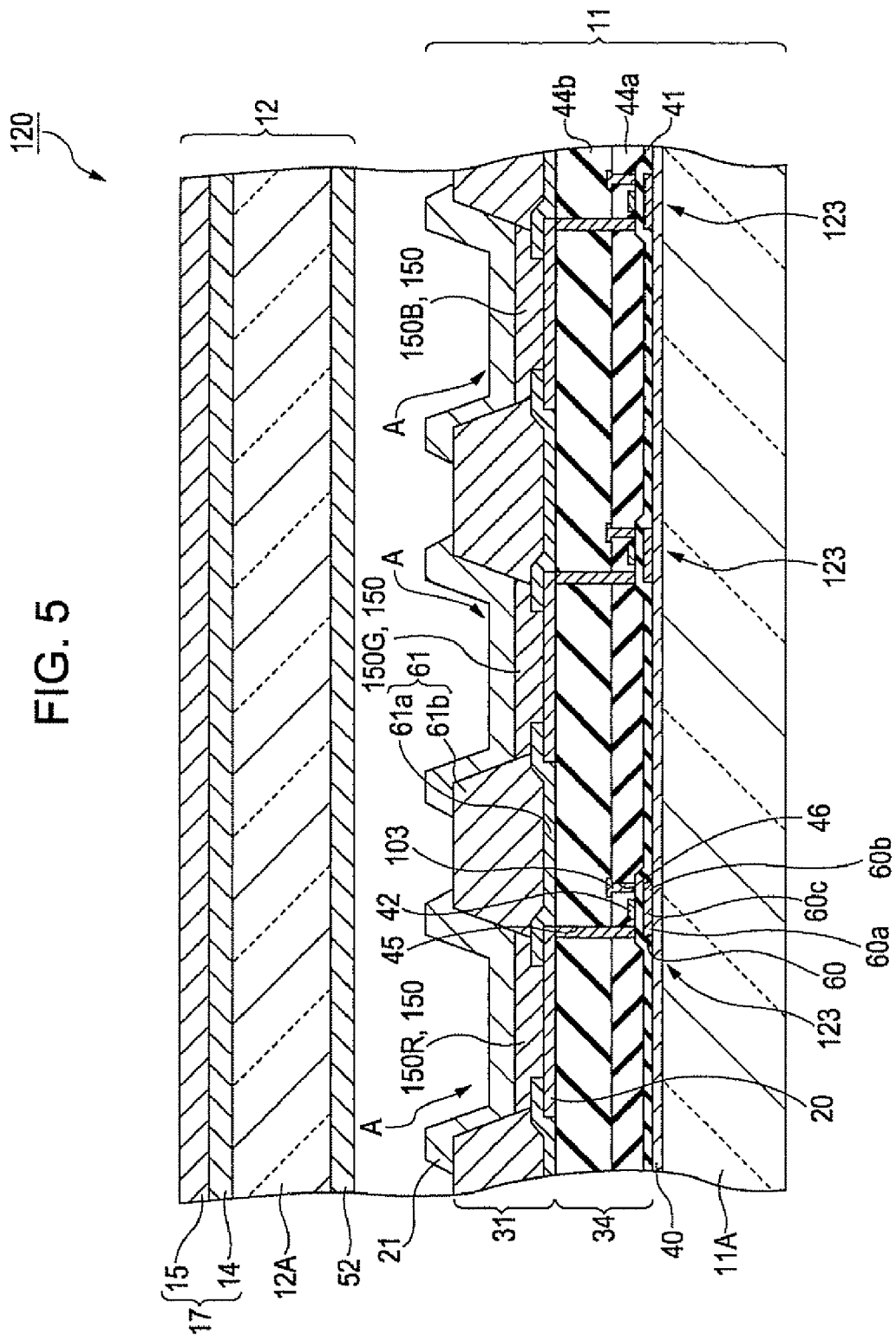
FIG. 5 is a sectional view that schematically illustrates an example of the configuration of an organic EL device having an input function according to a third exemplary embodiment of the invention.

Next, with reference to the accompanying drawings, an organic EL device having an input function according to a third exemplary embodiment of the invention is explained below. FIG. 5 is a sectional view that schematically illustrates the layer configuration of sub pixel regions. An organic EL device having an input function according to the present embodiment of the invention differs from the organic EL device 1 having an input function according to the first exemplary embodiment of the invention described above only in that, in the present embodiment of the invention, an individual light-emitting material corresponding to one of R, G, and B color components is provided in each of the sub pixel regions, thereby omitting a color filter layer. Except for the above difference, an organic EL device having an input function according to the present embodiment of the invention has the same configuration as that of the organic EL device 1 having an input function according to the first exemplary embodiment of the invention. Accordingly, in the following description, an explanation is given with a focus on the differentiating and characteristic feature described above. It should be noted that the same reference numerals are assigned to the same components as those of the touch-sensitive organic EL device 1 according to the first exemplary embodiment of the invention; and a detailed explanation thereof is omitted, or an explanation is simplified as long as the understanding of the unique feature of the invention is not impaired. It should be further noted that a hole-injection/hole-transportation layer is not illustrated in FIG. 5.

In the configuration of the organic EL device 120 having an input function according to the present embodiment of the invention, as illustrated in FIG. 5, the light-emitting layer 150 is made up of a set of three primary color component layers, that is, a red light emission layer 150R that emits red (R) light, a green light emission layer 150G that emits green (G) light, and a blue light emission layer 150B that emits blue (B) light. Each of these light emission layers 150R, 150G, and 150B is arrayed in a stripe pattern. Having such a configuration, the touch-sensitive organic EL device 120 according to the present embodiment of the invention performs full-color display.

In some cases, voltages whose levels are different from one another are applied to the red light emission material, the green light emission material, and the blue light emission material on an individual basis. For example, in a case where gamma correction is performed for each display color of R, G, and B on a separate basis, an individual voltage (needless to say, which does not mean the same single voltage) is applied to each one of three primary-color light emission materials where one voltage that is applied to one of these three primary-color light emission materials is not the same as the remaining two counterparts. In the configuration of the organic EL device 120 having an input function according to the present embodiment of the invention, the counter electrode 21 is formed on an individual basis so as to correspond to the display color of each of the R, G, and B primary color components. Such a configuration makes it possible to ensure a wide range of adjustment of an electric potential difference that occurs between the pixel electrode 20 and the counter electrode 21.

As an example of a modified configuration, lithium fluoride (LiF) may be deposited between the light-emitting layer 150 and the counter electrode 21 in order to improve light emission efficiency. An alternative material other than lithium fluoride may be used for the red light emission layer 150R and the green light emission layer 150G. As another modification example, calcium only may be formed on the red light emission layer 150R and the green light emission layer 150G without forming lithium fluoride.

The organic EL device 120 having an input function according to the present embodiment of the invention has the shield electrode 52 that is formed on the inner surface (i.e., surface opposed to the element substrate 11) of the base substrate substance 12A of the sealing substrate 12 and further has the touch panel unit 17 that is formed on the outer surface of the base substrate substance 12A of the sealing substrate 12. In this respect, the organic EL device 120 having an input function according to the present embodiment of the invention has the same configuration as that of the organic EL device 1 having an input function according to the first exemplary embodiment of the invention described above.

The organic EL device 120 having an input function according to the present embodiment of the invention offers the same advantageous working effects that are achieved by the organic EL device 1 having an input function according to the first exemplary embodiment of the invention described above. In addition thereto, in the configuration of the touch-sensitive organic EL device 120 according to the present embodiment of the invention, it is not necessary to provide a color filter layer at all, which makes it possible to reduce the thickness of the sealing substrate 12. By this means, the organic EL device 120 having an input function according to the present embodiment of the invention features a reduced size.

Fourth Embodiment

Figure 6:
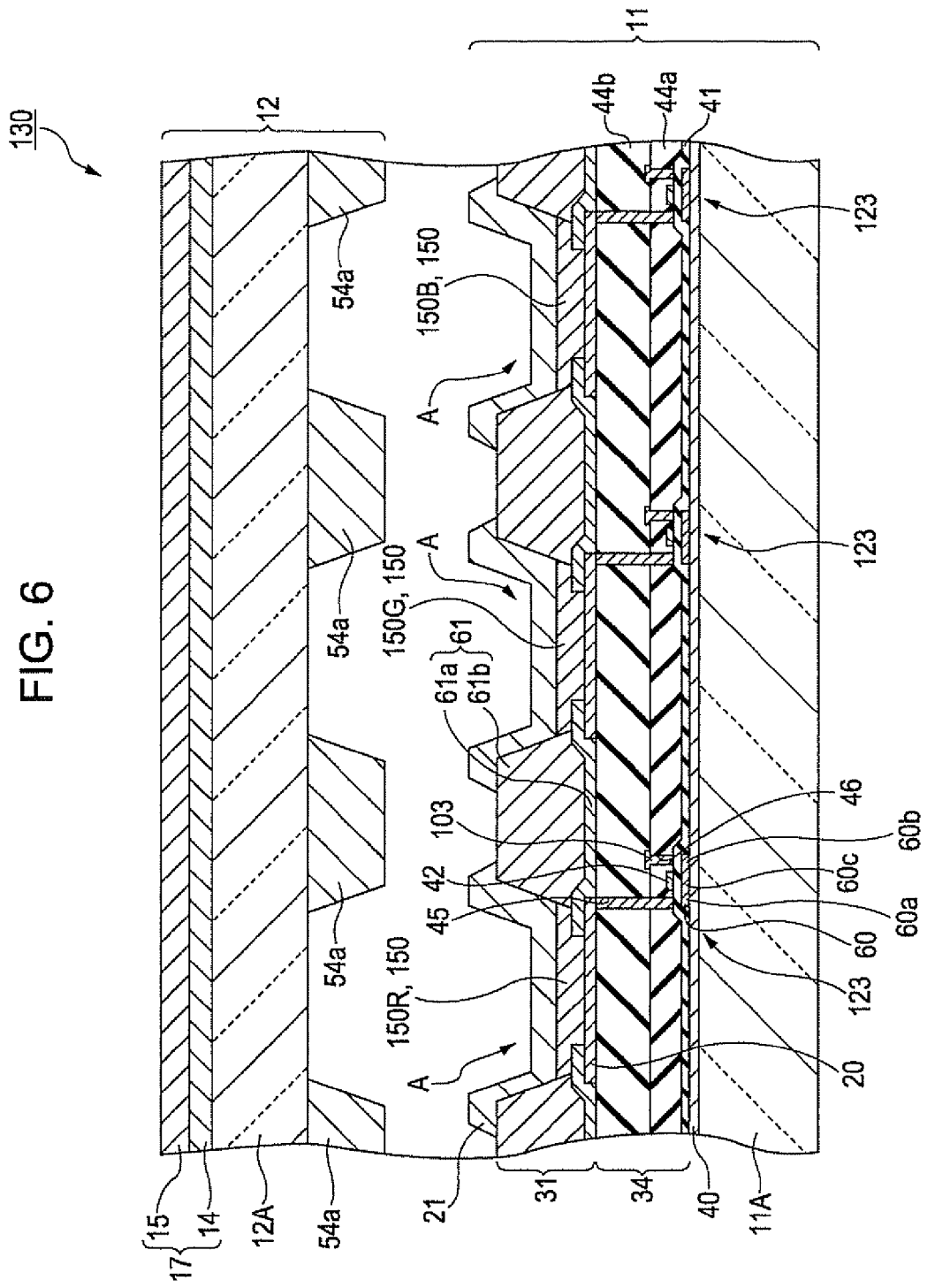
FIG. 6 is a sectional view that schematically illustrates an example of the configuration of an organic EL device having an input function according to a fourth exemplary embodiment of the invention.

Next, with reference to the accompanying drawings, an organic EL device having an input function according to a fourth exemplary embodiment of the invention is explained below. FIG. 6 is a sectional view that schematically illustrates the layer configuration of sub pixel regions. An organic EL device having an input function according to the present embodiment of the invention differs from the organic EL device 110 having an input function according to the second exemplary embodiment of the invention described above only in that a color filter layer is not provided in the present embodiment of the invention. Except for the above difference, an organic EL device having an input function according to the present embodiment of the invention has the same configuration as that of the organic EL device 110 having an input function according to the second exemplary embodiment of the invention. Accordingly, in the following description, an explanation is given with a focus on the differentiating and characteristic feature described above. It should be noted that the same reference numerals are assigned to the same components as those of the touch-sensitive organic EL device 110 according to the second exemplary embodiment of the invention; and a detailed explanation thereof is omitted, or an explanation is simplified as long as the understanding of the unique feature of the invention is not impaired.

The organic EL device 130 having an input function according to the present embodiment of the invention has the light-shielding portion 54a that demarcates (i.e., partitions, or defines the boundary of) the plurality of sub pixel regions A in a plan view and also functions as the shield electrode. The light-shielding portion 54a of the organic EL device 130 having an input function according to the present embodiment of the invention is formed on the inner surface (i.e., surface opposed to the element substrate 11) of the base substrate substance 12A of the sealing substrate 12. In this respect, the organic EL device 130 having an input function according to the present embodiment of the invention has the same configuration as that of the organic EL device 110 having an input function according to the second exemplary embodiment of the invention described above. The light-shielding portion 54a is formed at regions of the sealing substrate 12 that substantially correspond to, that is, substantially overlap in a plan view, regions of the element substrate 11 where the counter electrode 21 is not formed. The light-shielding portion 54a is electrically connected to the aforementioned circuitry that is provided on the element substrate 11 via the aforementioned inter-substrate electro-conductive terminals, which are provided on the edge region of the sealing substrate 12. With the electric connection to the circuitry, the light-shielding portion 54a is controlled to have a certain fixed electric potential (e.g., ground potential).

As explained above, the organic EL device 130 having an input function according to the present embodiment of the invention offers the same advantageous working effects that are achieved by the organic EL device 110 having an input function according to the second exemplary embodiment of the invention described above. In addition thereto, in the configuration of the touch-sensitive organic EL device 130 according to the present embodiment of the invention, the light-shielding portion 54a also functions as the shield electrode. Therefore, it is possible to reduce the number of parts and components that make up the sealing substrate 12 of the organic EL device 130 having an input function. Thus, it is possible to reduce the thickness of the sealing substrate 12 of the organic EL device 130 having an input function. In addition to the above, since the shield electrode (i.e., light-shielding portion 54a) is provided only at regions where the light-shielding film is formed, optical output efficiency is not sacrificed.

Fifth Embodiment

Figure 7:
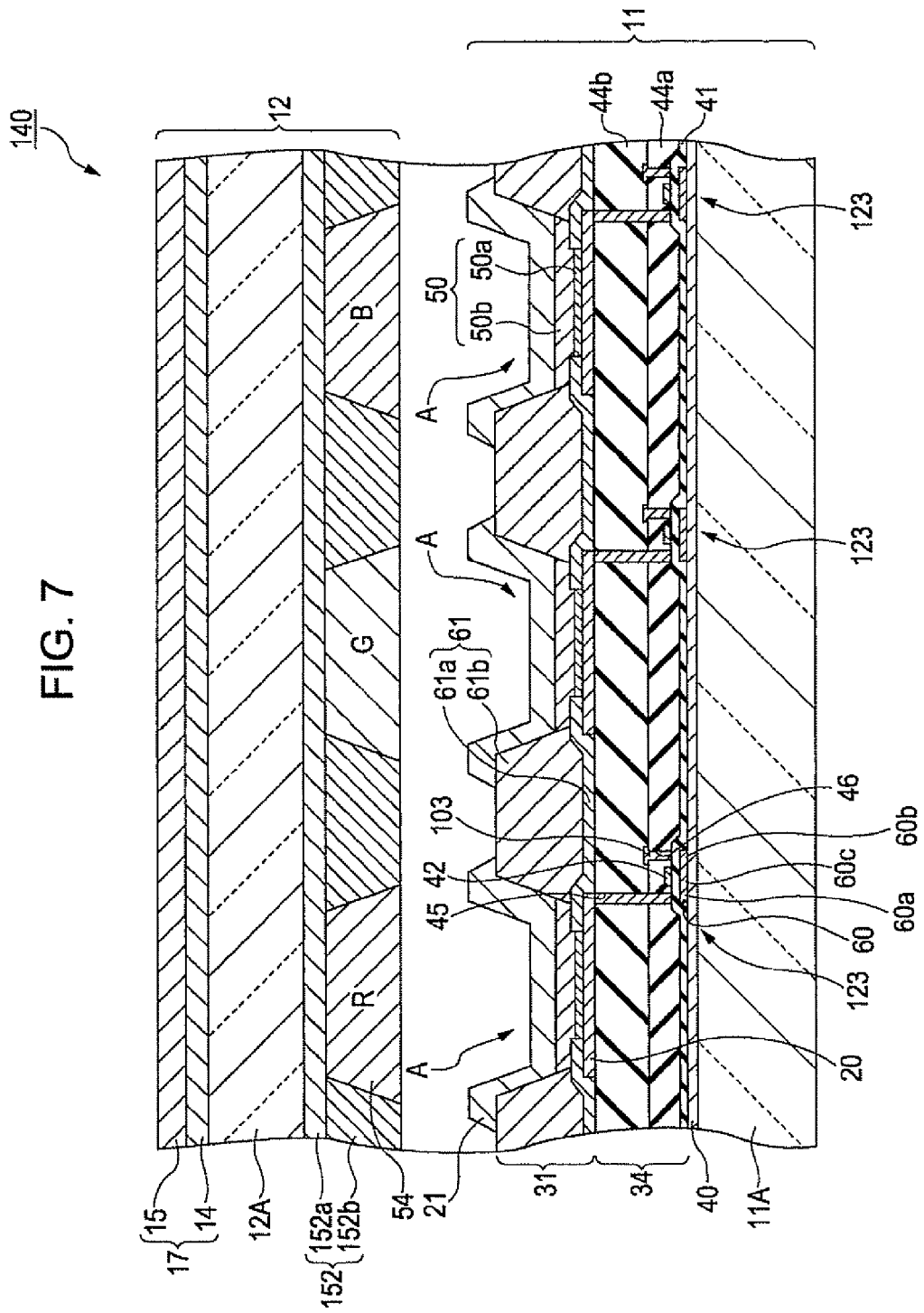
FIG. 7 is a sectional view that schematically illustrates an example of the configuration of an organic EL device having an input function according to a fifth exemplary embodiment of the invention.

Next, with reference to the accompanying drawings, an organic EL device having an input function according to a fifth exemplary embodiment of the invention is explained below. FIG. 7 is a sectional view that schematically illustrates the layer configuration of sub pixel regions. An organic EL device having an input function according to the present embodiment of the invention is characterized in that it is provided with a shield conductor that combines the layer configuration explained in the first exemplary embodiment of the invention and the layer configuration explained in the second exemplary embodiment of the invention. Accordingly, in the following description, an explanation is given with a focus on the differentiating and characteristic feature of the configuration of the shield conductor that combines the feature explained in the first exemplary embodiment of the invention and the feature explained in the second exemplary embodiment of the invention. It should be noted that the same reference numerals are assigned to the same components as those of the touch-sensitive organic EL device 1 according to the first exemplary embodiment of the invention and those of the touch-sensitive organic EL device 110 according to the second exemplary embodiment of the invention; and a detailed explanation thereof is omitted, or an explanation is simplified as long as the understanding of the unique feature of the invention is not impaired.

As illustrated in FIG. 7, in the configuration of an organic EL device 140 having an input function according to the present embodiment of the invention, a shield electrode 152 is made up of a light-transmissive portion 152a and a light-shielding portion 152b. The light-transmissive portion 152a is formed on the entire image display area of the sealing substrate 12. The light-shielding portion 152b functions as a light-shielding film. In addition to the above, in the configuration of the organic EL device 140 having an input function according to the present embodiment of the invention, the color filter layer 54 is formed on regions where the light-shielding portion 152b is not formed.

The light-transmissive portion 152a of the shield electrode 152 is made of a transparent material having optical transparency such as ITO or the like. On the other hand, the light-shielding portion 152b thereof is made of a light-absorbing electrical conducting material. As a non-limiting example thereof, the light-shielding portion 152b is made of a light-absorbing metal material such as chromium (Cr) or a light-absorbing resin material with carbon black being dispersed therein.

The light transmission factor of the light-transmissive portion 152a depends on its film thickness. Therefore, in order to heighten the light transmission factor of the light-transmissive portion 152a, it is necessary to make the film thickness of the light-transmissive portion 152a smaller. If done so, however, the resistance value of the light-transmissive portion 152a increases, which is undesirable.

Nevertheless, it is possible to adjust the resistance value of the shield electrode 152 as a whole by adjusting the film thickness of the light-shielding portion 152b because the light-shielding portion 152b does not have to have optical transparency. That is, in the configuration of the organic EL device 140 having an input function according to the present embodiment of the invention, it is possible to counterbalance an increase in the resistance value due to the reduced film thickness of the light-transmissive portion 152a with a decrease in the resistance value obtained by adjusting the film thickness of the light-shielding portion 152b. By this means, it is possible to maintain the resistance value of the shield electrode 152 as a whole at a predetermined value, that is, for example, 1 k$\Omega$/sq or less. In addition, since the shield electrode 152 is formed in a planar pattern, that is, as a sheet, on the image display area, it is possible to effectively and reliably block the adverse effects of a noise and to output light that is emitted from the light-emitting layer 50 to the outside with high optical efficiency. Moreover, in the configuration of the organic EL device 140 having an input function according to the present embodiment of the invention, the light-shielding portion 152b makes it possible to avoid the occurrence of optical leakage through a gap between each two adjacent ones of the plurality of sub pixel regions A.

As explained above, the organic EL device 140 having an input function according to the present embodiment of the invention is provided with the shield electrode 152 having the light-transmissive portion 152a and the light-shielding portion 152b. With such a configuration, it is possible to output light that is emitted from the light-emitting layer 50 to the outside with high optical efficiency. Furthermore, the shield electrode 152 of the organic EL device 140 having an input function according to the present embodiment of the invention makes it possible to prevent the accuracy of contact detection of a touch-panel user input made at the touch panel unit 17 from being lowered due to an electric field component noise. Thus, the improved detection accuracy featured by the organic EL device 140 having an input function according to the present embodiment of the invention ensures high performance and high reliability. It should be noted that, as in the configuration of the organic EL device 120 having an input function according to the third exemplary embodiment of the invention and the configuration of the organic EL device 130 having an input function according to the fourth exemplary embodiment of the invention described above, the light-emitting layer 50 may be made up of a red light emission layer, a green light emission layer, and a blue light emission layer so as to correspond to the display color of each of the R, G, and B primary color components. Even in such a modified configuration, the same advantageous working effects as those described above are produced.

Electronic Apparatus

Figure 8:
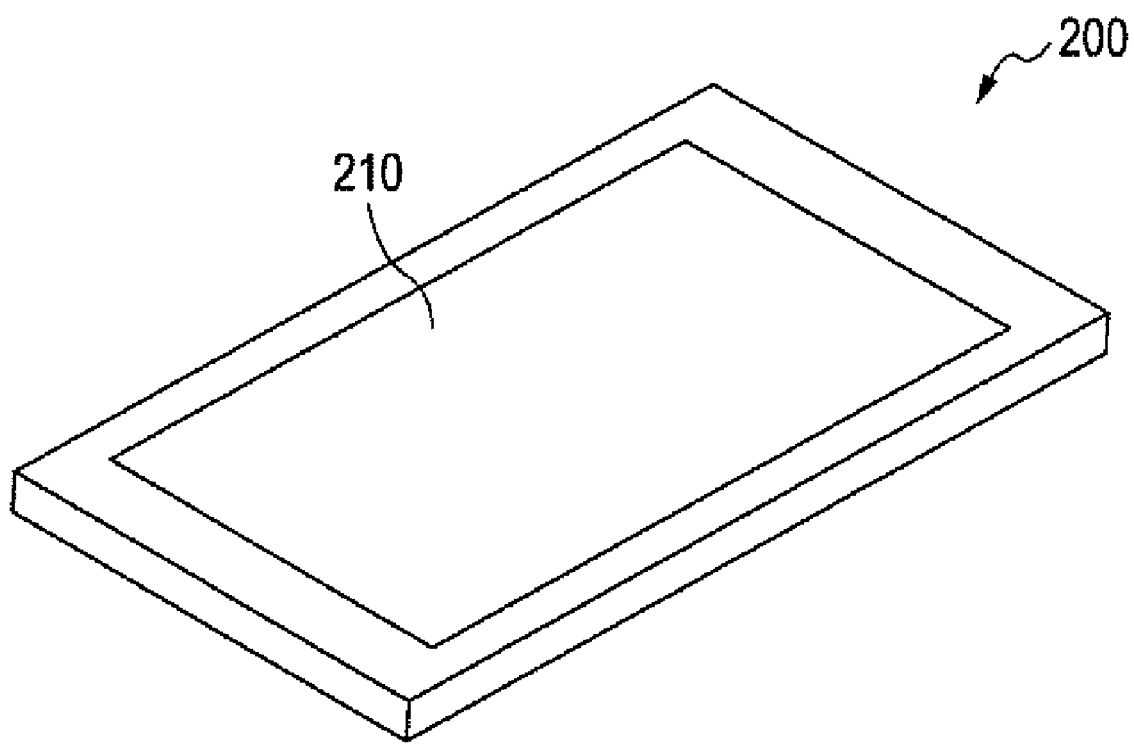
FIG. 8 is a diagram that schematically illustrates an example of the configuration of a personal digital assistant (PDA), which is a non-limiting example of an electronic apparatus according to an exemplary embodiment of the invention.

The touch-sensitive organic EL device 1 having a configuration described above is used, for example, as a display unit 210 of a personal digital assistant (PDA) illustrated in FIG. 8. That is, the PDA 200 is provided with, as its display unit 210, an organic EL device having an input function according to any of exemplary embodiments of the invention described above.

Since the PDA 200 according to the present embodiment of the invention is provided with, as its display unit 210, the organic EL device 1 having an input function that is capable of making a touch panel contact detection with an enhanced detection accuracy, which is free from an electric field component noise, it features greater performance in the detection of a touch panel user input with an increased reliability.

Although various exemplary embodiments of the present invention are described above, needless to say, the invention is in no case restricted to these exemplary embodiments described herein; the invention may be configured in an adaptable manner in a variety of variations and/or modifications without departing from the spirit thereof. For example, although it is explained in the foregoing exemplary embodiments that the shield electrode is electrically connected to the circuitry that is provided on the element substrate via the inter-substrate electro-conductive terminals, which are provided on the edge region of the sealing substrate, and that, with the electric connection to the circuitry via the inter-substrate electro-conductive terminals, the shield electrode is controlled to have a certain fixed electric potential, the invention should be in no case understood to be limited to such a specific example. Any other alternative method may be used as long as the electric potential of the shield electrode is fixed.

In addition, although it is explained in the foregoing exemplary embodiments that the touch panel unit conforms to the capacitive sensing scheme, the invention should be in no case understood to be limited to such a specific example. Any other alternative sensing scheme may be used in place of the capacitive sensing scheme. For example, the invention is also applicable to an organic EL device having an input function that is provided with a touch panel conforming to a resistance film scheme.

Among a variety of electronic apparatuses to which an organic EL device having an input function according to the foregoing exemplary embodiments of the invention is applicable are, other than the personal digital assistant illustrated in FIG. 9, a mobile personal computer, a notebook-sized personal computer, a mobile phone, a workstation, a digital still camera, a monitor for automobile use, a car navigation device, a head-up display, a digital video camera, a television, a video tape recorder of a viewfinder type or a direct monitor view type, a pager, an electronic personal organizer, an electronic calculator, an electronic book, a projector, a word processor, a videophone, a POS terminal, and so forth

What is claimed is:

1. An organic electroluminescence device having an input function, comprising:
    an element substrate that has a light-emitting layer sandwiched between a positive electrode and negative electrode in each of a plurality of sub pixel regions that are arrayed in a matrix pattern;
    a sealing substrate that seals the element substrate; and
    a touch panel section that is provided at the outer-surface side of the sealing substrate,
    wherein the negative electrode is formed on an individual basis so as to correspond to the display color of each of the sub pixel regions; and
    the sealing substrate has a shield conductor that is formed on the element-substrate side of the sealing substrate, the shield conductor having a ground potential.

2. The organic electroluminescence device having an input function according to claim 1, wherein the shield conductor constitutes a light-shielding film.

3. The organic electroluminescence device having an input function according to claim 1, wherein the shield conductor has optical transparency.

4. The organic electroluminescence device having an input function according to claim 1, wherein the shield conductor has a light-transmissive portion that is formed in a planar pattern on the inner surface of the sealing substrate and a light-shielding portion that functions as a light-shielding film.

5. An electronic apparatus that is provided with the organic electroluminescence device having an input function according to claim 1.

* * * * *